United States Patent [19]
Davis

[11] Patent Number: 5,455,732
[45] Date of Patent: Oct. 3, 1995

[54] BUFFER PROTECTION AGAINST OUTPUT-NODE VOLTAGE EXCURSIONS

[75] Inventor: Jeffery B. Davis, Raymond, Me.

[73] Assignee: National Semiconductor Corporation, Santa Clara, Calif.

[21] Appl. No.: 122,232

[22] Filed: Sep. 15, 1993

[51] Int. Cl.$^6$ .............................................. H03K 19/0175
[52] U.S. Cl. .................. 361/90; 361/56; 361/84
[58] Field of Search ................................. 361/56, 91, 118, 361/119, 90, 92, 84; 307/270, 443, 451, 473, 475

[56] References Cited

U.S. PATENT DOCUMENTS

| | | | |
|---|---|---|---|
| 5,149,991 | 9/1992 | Rogers | 307/443 |
| 5,160,855 | 11/1992 | Dobberpuhl | 307/270 |
| 5,381,061 | 1/1995 | Davis | 326/57 |

FOREIGN PATENT DOCUMENTS

| | | | |
|---|---|---|---|
| 0498377 | 8/1992 | European Pat. Off. | H03K 17/08 |
| 0556605 | 8/1993 | European Pat. Off. | H03K 19/0185 |

Primary Examiner—Marc S. Hoff
Assistant Examiner—Stephen Jackson
Attorney, Agent, or Firm—Thomas L. Bohan

[57] ABSTRACT

A three-state output buffer circuit with built-in protection against power-rail corruption by bus-imposed voltages when the buffer is in its high-impedance state. In particular the invention protects the high-potential power rail of the high-Z buffer against voltages appearing at the buffer's output node which exceed the voltage of the buffer's high-potential rail. It prevents this overvoltage from finding its way to the power-rail, and thus has application to those situations where a common bus is coupled to a variety of circuits including, for example, 3.3-volt buffers and 5-volt buffers. The invention provides this protection without the "dead zone" of prior-art and related-art circuits. Furthermore, the present invention also has application where it is the low-potential power rail that needs protecting, in situations where the bus may impose voltages at the buffer's output node that are lower than the voltage of the buffer's low-potential power rail. The protection circuit utilizes a pseudo-power rail which can be used to adjust the bias on the output transistor's bulk and so to prevent a leakage path from occurring between the output node and a power rail via the output transistor source/bulk junction. To minimize or avoid a "dead zone" in the charging of the pseudo-rail, a one-way link is established directly between the power rail and the pseudo-power-rail.

25 Claims, 6 Drawing Sheets

BUFFER PROTECTION AGAINST OUTPUT-NODE VOLTAGE EXCURSIONS

BACKGROUND OF THE INVENTION

1. Field of the Invention

The present invention relates to buffer circuits designed to be coupled to a common bus. In particular, it relates to protecting such buffers against bus-imposed output-node voltages lying outside the buffers' rail-to-rail voltage range. More particularly, this invention relates to "over-voltage" and "under-voltage" protection of buffers in their high-impedance state. It provides overvoltage protection for buffers having a high-potential-power-rail voltage lower than voltages which may be imposed on the common bus by the other output circuits coupled to that bus; it provides under-voltage protection for buffers having a low-potential-power-rail voltage higher than voltages which may be imposed on the common bus by the other circuits coupled to that bus.

2. Description of Prior Art

Developments in the field of digital electronic circuits over the past few years have increased the variety of circuits which may end up connected to a common bus. This has increased the likelihood that the output voltage imposed on the bus by one circuit may be deleterious to one or more of the other circuits connected to the bus. For example, buffer circuits are now being produced which are designed to be powered by high-potential power rails $V_{cc}$ having considerably lower voltages than has been the case previously; it is important to be able to integrate these new circuits with buffers powered by the higher $V_{cc}$ which—until recently—were customary. The big shift has been from MOSFET circuits with $V_{cc}$ levels at a nominal voltage of 5 volts to MOSFET circuits with $V_{cc}$ levels at a nominal voltage of 3.3 volts. (These circuits are occasionally referred to as "3-volt circuits" or "3-volt buffers." Future developments will include circuits utilizing even lower $V_{cc}$ values. Consequently, the comments made here regarding circuits incorporating high-potential power rails of nominal voltages of 3.3 and 5, respectively, and a low-potential power rail at GND, should be taken as applying to any situation where the voltage of either power rail varies among the buffers coupled to a common bus.) Circuits using the nominal 3.3-volt $V_{cc}$ comply with the new JEDEC Standard 8-1A, which should be compared with JEDEC Standards 18 and 20, for 5-volt digital circuits. Under 8-1A, $V_{oL}$—logic-low—is in the range 0.36–0.55 volts and $V_{oH}$—logic-high—is in the range 2.0–2.4 volts. This compares with the logic levels under Standards 18 and 20, where $V_{oL}$=0.36–0.55 volts and $V_{oH}$=3.65–4.4 volts.

One key observation regarding the different standards is that the entire range of logic-high under the 5-volt standards exceeds the $V_{cc}$ level under JEDEC Standard 8-1A. This means that when sub-circuits complying with these different Standards are combined into a single extended circuit, a number of subtle problems have to be solved in order to ensure that the 3.3-volt high-potential power rail does not serve as a sink for current originating at the 5-volt high-potential rail. The present invention addresses this problem in the context of an array of output buffers coupled to a common bus but powered by high-potential power rails at different voltages. For definiteness, the different buffers will be referred to as 3.3-volt and 5-volt buffers, respectively. Nevertheless the approach of the present invention is not limited to this combination. Indeed, the buffer of interest may need to be protected not just against MOSFET buffers with high output voltages; it may also need protection against buffers with bipolar outputs only slightly above the $V_{cc}$ of the buffer of interest. Furthermore, the same broad approach will serve to provide protection to an output buffer connected to a common bus capable of being driven negative with respect to the buffer's low-potential power rail.

When the output node of an unprotected 3.3-volt buffer is driven to a voltage corresponding to logic-high for a 5-volt buffer, a current path will be set up between the high-potential power rail of the 5-volt buffer and that of the 3.3-volt buffer—indeed between the 5-volt buffer and all of the unguarded 3.3-volt buffers coupled to the common bus. This will result at best in excessive power consumption and at worst in temporary or permanent malfunctioning of the circuit, as the high-potential power rail of the 3.3-volt buffer is "corrupted" by the higher potential. The reason for this is clear from the circuit layout and physics of the included devices. The typical output buffer has a PMOS output pullup transistor and an NMOS output pulldown transistor. In the simple circuit the PMOS transistor's drain is connected directly to the buffer's output node and its source is connected to the buffer's high-potential power rail $V_{cc}$, as is this PMOS transistor's bulk (sometimes referred to as the "NWELL" or "backgate"). The overvoltage threat is of greatest concern for the buffer in its inactive, high-Z state, since typically it is only then that the other buffers will be current-sourcing to the common bus. A high-Z buffer's pullup and pulldown stages should both present a high impedance to the bus. With respect to the pullup stage, the inactive buffer's output-pullup-transistor-gate will be held at logic-high to ensure that the pullup transistor is "off," that is, that it has no source-to-drain conduction channel. Unfortunately, the unprotected pullup transistor presents an alternate conduction route to an overvoltage imposed at the output node, namely, its drain-to-bulk pn junction, as can be seen by the nature of the device and the circuit. This pn junction will be forward biased by an overvoltage at the buffer's output node. A typical (enhancement mode) PMOS transistor in an integrated-circuit chip will have two $p^+$ regions, one for the drain and the other for the source, embedded in a large n-doped region, the "NWELL." Therefore, if the drain (connected to the output node) is made sufficiently positive with respect to the bulk (connected to $V_{cc}$), this junction will become forward-biased and current pass through it from the buffer's output node (and hence the bus) to the high-potential rail powering the buffer.

Note that the PMOS pullup transistor described above is turned on by making its gate (connected elsewhere in the buffer) sufficiently negative with respect to either $p^+$ region such that holes diffuse to the surface of the NWELL in sufficient quantity to set up a p-type channel linking drain and source, i.e., linking the two $p^+$ regions. The minimum gate-to-source voltage necessary to establish a minimal channel is the PMOS transistor's threshold voltage, $V_{TP}$. This threshold voltage can be made to vary over a wide range by the particular fabrication techniques used. (For depletion-mode PMOS transistors, there is a channel present even when the source-to-gate voltage is zero; for enhancement-mode devices, the transition voltage can be reduced to close to zero.)

There have been previous attempts to circumvent the problem caused by overvoltages imposed on a buffer's output node, attempts to make the buffer "overvoltage tolerant." The simples approach has started at the obvious place, the coupling between $V_{cc}$ and the output node at the pullup transistor's drain-bulk pn junction. The bulk-source connection has been broken, and the bulk coupled directly to a "pseudo power rail," $PV_{cc}$, introduced into the circuit. Switching means also introduced to the circuit provide that $PV_{cc}$ is coupled either to the actual high-potential power rail $V_{cc}$ or to the output node. In effect, the switching means is a voltage-comparator which couples to the pullup transistor bulk whichever of its two inputs-that from the output node and that from its high-potential power rail $V_{cc}$—is at the greater voltage. A particular related-art circuit using this approach is described in application Ser. No. 08/024,942 filed by the present inventor on Mar. 2, 1993: Overvoltage-Tolerant Output Buffer Circuit. The basic output buffer circuit in question is set out in FIG. 1. PMOS transistor QP4 is the output pullup transistor of the circuit, which is to be coupled to a bus at the output node OUT. Note that QP4's bulk, instead of being tied directly to the source node and hence to the high-potential power rail $V_{cc}$, is coupled to line $PV_{cc}$, the "pseudo-high-potential-power-rail." $PV_{cc}$ is connected to the output of the comparator COMP, the inputs for which are, respectively, $V_{cc}$ and the output node OUT.

Figure 1:
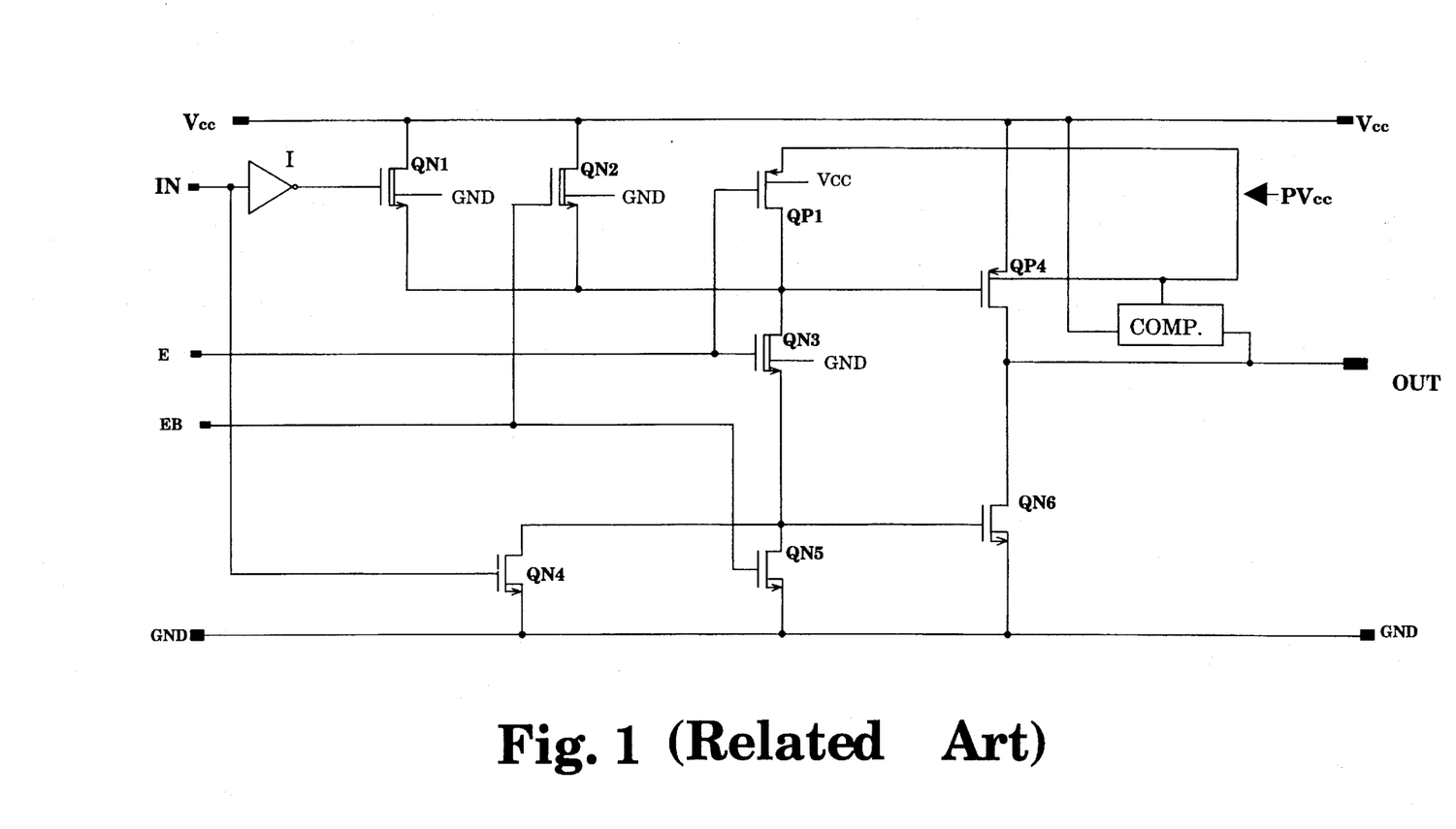
FIG. 1 (Related Art) A three-state output buffer circuit with overvoltage protection for its high-potential power rail.

In the buffer of FIG. 1, NMOS transistor QN6 is the output pulldown transistor, driven by pulldown-transistor driver transistor QN4. Transistor QN5 is the pulldown-transistor disabler. NMOS transistor QN1 is the pullup-transistor driver. QN2, with its gate tied to the enable complement input EB, is the pullup transistor disabler. Finally, low-$V_{TN}$ transistor serves in the active bi-state buffer to pull up the gate of output pulldown transistor QN6 whenever a logic-low signal is received at the data input IN.

The output-guarding aspects of the circuit in FIG. 1 can be understood as follows. As long as only logic-low and -high signals commensurate in amplitude to those produced by this buffer appear on the bus, the voltage at the output node OUT will always be lower than $V_{cc}$, and the comparator will couple $PV_{cc}$ to the true high-potential power rail; $PV_{cc}$ will therefore be at voltage $V_{cc}$. Under these circumstances the buffer acts just as it would without the overvoltage protection, like the circuit that has its pullup transistor bulk connected in common to its source. On the other hand, for output voltages greater than $V_{cc}$ the comparator ensures that $PV_{cc}$ is coupled directly to the output node. This means that the pullup transistor's bulk will be at the same potential as its drain and consequently that no current will pass through the drain-bulk junction. The alternate current path between the bus and $V_{cc}$ has thereby been closed off. Unfortunately, without more, this advantage can be at the expense of providing a direct path through the turned-on pullup transistor QP4. In the unprotected circuit, the pullup transistor's gate will be held at voltage $V_{cc}$ while the buffer is in its high-Z state, to ensure that it remains off. However, with the drain (and the bulk) of QP4 at the voltage of $PV_{cc}$, the gate may become negative with respect to the drain/bulk by more than $V_{TP}$; this will turn on QP4 and provide a direct path from OUT to the high-power potential rail. To avoid this, a feedback transistor QP1 with its gate connected to the enable input E is coupled between $PV_{cc}$ and the gate of QP4. With the buffer disabled, QP1 is held on by the logic-low E voltage. This results in $PV_{cc}$ being applied to the gate of QP4 during this period; hence it eliminates the QP4 gate-to-bulk voltage and results in QP4 being held off. One final "fix" is used in FIG. 1 in order to completely contain an overvoltage at the output node; this is the use of the NMOS transistor QN1—rather than a PMOS transistor—as the driver for the pullup transistor QP4 (and for the insertion of the invertor I to ensure proper logic function) and for the use of a second NMOS transistor QN2 as the pullup disabler driver. Conventionally, PMOS transistors coupled between $V_{cc}$ and the pullup transistor gate are used for both of these functions. Were that done in this circuit, the overvoltage on the pullup transistor gate would bull its way through these driver transistors to the high-potential power rail. In short, the over-voltage would find its way back to $V_{cc}$ thorough the channels and/or the drain-isolation pn junctions of those PMOS driver transistors. The NMOS transistors used as the pullup transistor drivers in FIG. 1, in contrast, constitute blocking transistors for an overvoltage. As noted, to accommodate this substitution the data input signals must be complemented to maintain correct logic, all as shown in FIG. 1. To ensure that the NMOS transistors QN1 and QN2 can charge the gate of QP4 high enough to hold it off, NMOS transistors with low turn-on threshold voltages $V_{TN}$ (and hence low drop along the channel when they are on) are used—as low as 0.4–0.5 volts, in contrast with the typical 0.85 volts. In fact, with some circuit adjustments, these can be chosen to be depletion-mode transistors to ensure well-controlled low threshold values. The symbol with the double line joining drain to source is used to indicate that a special low-$V_{TP}$ transistor, possibly a depletion-mode transistor, is used at that location.

Figure 2:
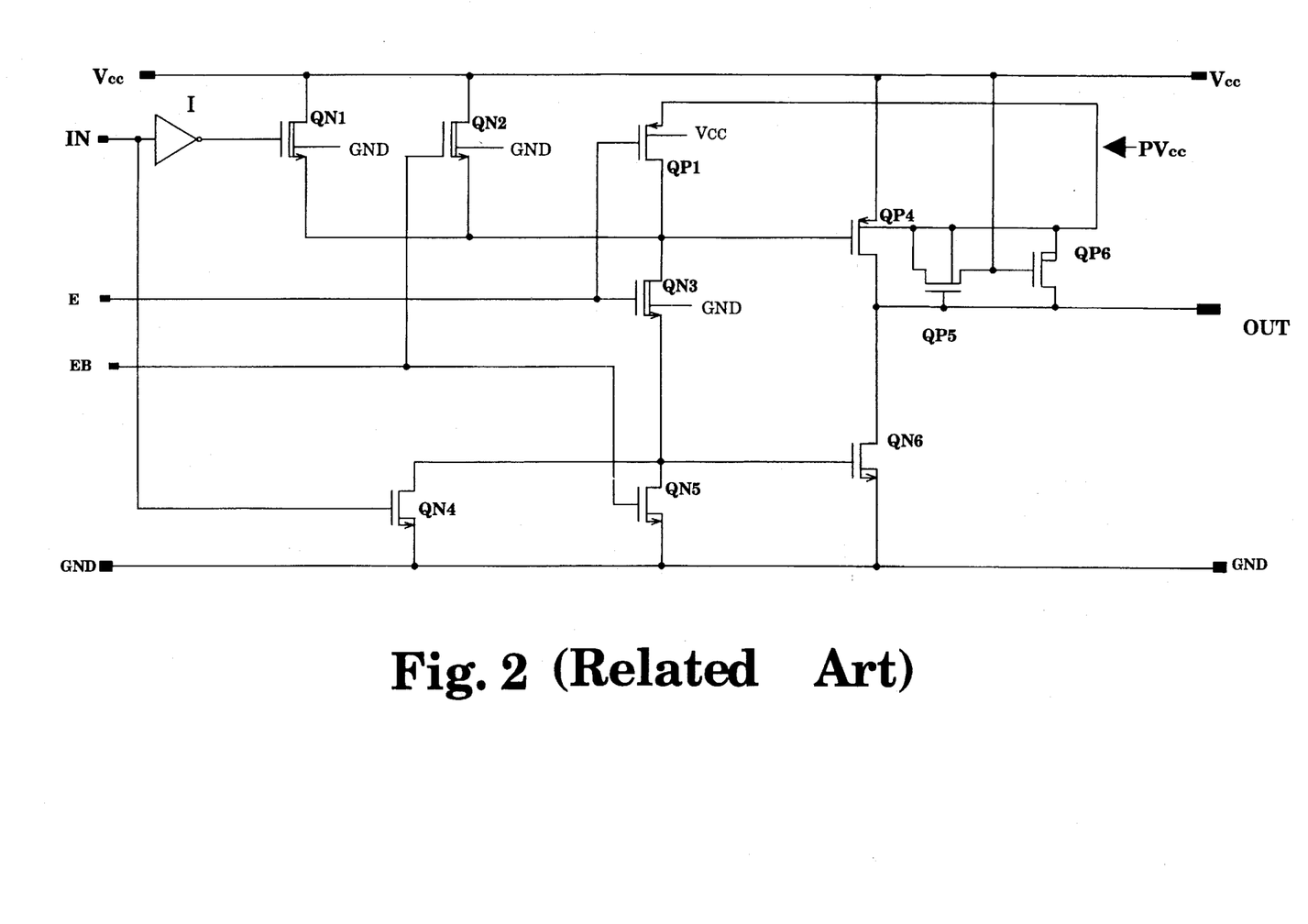
FIG. 2 (Related Art) Circuit of FIG. 1 shown with an explicit comparator circuit.

Unfortunately, there is no ideal comparator available such as is implied in the discussion of the circuit of FIG. 1. There is no comparator so sensitive that it will select the higher of two inputs, regardless of how small the voltage difference between them. In FIG. 2, the related art is shown with a real, as opposed to an ideal, comparator. As will be seen, this comparator, made up of the PMOS pair QP5 and QP6, will be unable to distinguish between input voltages that differ by less than $V_T$.

The principal current path of QP6 lies between OUT and $PV_{cc}$ and QP6's gate is at fixed-potential $V_{cc}$. (Note that the bulk of QP6 is tied to $PV_{cc}$, as is the bulk of QP5.) The operation and limitations of the comparator circuit of FIG. 2 can be understood by considering the various signals that can be imposed on the buffer's output node OUT while the buffer is in its high-Z state (pullup transistor QP4 and pulldown transistor QN6 both held off).

First consider the common bus to be held at a logic-low voltage $V_{oL}$(>GND) by one of the other circuits attached to the bus. This will cause QP5 to be on; with its source at $V_{cc}$ and its gate at $V_{oL}$ its source-to-gate voltage is considerably greater than the threshold needed to turn it on. With QP5 on, the high-potential power rail $V_{cc}$ is coupled directly to the pseudo-rail $PV_{cc}$: the potential on the pseudo-rail will be the same as on the high-potential power rail $V_{cc}$. It follows that QP6, with no voltage drop between its bulk/source and its gate, will be cut off. Since, by definition, the voltage imposed at OUT is lower than $V_{cc}$—the potential of QP4's bulk—the pn junction joining the drain and bulk of QP4 will be reverse-biased, preventing any current path between OUT and $V_{cc}$.

Next consider that—with the buffer depicted in FIG. 1 still inactive—the bus is driven to a logic-high which is less than $V_{cc}$ by an amount $|V_{TP}|$ or greater. Nothing will change; QP5 will continue to be on and QP6 will continue to be off, for the same reasons as before, and $PV_{cc}$ consequently will remain at the potential $V_{cc}$.

Next consider that one of the 5-volt buffers coupled to the bus outputs a logic-high signal $V_{oH}$>($V_{cc}$+$V_{TP}$). The gate bias of QP5 will become positive with respect to its bulk/source and this transistor will be shut off. The pn junction of QP6 which couples the OUT node to the bulk (at $V_{cc}$) will become forward-biased, effectively increasing the QP6 bulk voltage to a level which is positive with respect to its gate by more than $V_{TP}$, thus turning QP6 on and coupling the output node OUT to the pseudo-rail $PV_{cc}$.

With the pseudo-rail controlled in the way set out above, now consider that the bus voltage drops back again to a voltage lower than $V_{cc}$ by an amount greater than $V_{TP}$, i.e., that the voltage at OUT becomes less than $(V_{cc}-|V_{TP}|)$. This serves to immediately turn on QP5, reconnecting the high-potential rail $V_{cc}$ directly to $PV_{cc}$ and hence to the bulk of QP4 and to the source of QP6. Since the gate of QP6 always is fixed at $V_{cc}$, this cuts off QP6.

In spite of the protection afforded by the protection circuit utilizing the comparator described above, it is clear that there is a "dead zone" in which the difference between the $V_{cc}$ and the output node voltage is insufficient for the comparator to act. In particular, consider the bus making a transition from a logic-low voltage to a voltage greater than $V_{cc}$ but by an amount less than the threshold voltage $V_{TP}$ for the PMOS transistors QP5 and QP6. With continuing reference to FIG. 1, it can be seen that QP6, initially cut off, will remain off and that QP5, initially on, will be cut off. The result is that $PV_{cc}$ will be left floating as far as the comparator is concerned; it will be connected to neither comparator input. Consider what happens when $PV_{cc}$ is riding at $V_{oH+}$ when this occurs. This is a higher voltage than will be present on any of the other elements of the circuit. This means in particular that this high voltage will appear on the bulk and gate of the pullup transistor QP4, while the drain and source of QP4 will be much lower. This presents the hazard that leakage from the charged pseudo-power line $PV_{cc}$ through the thin gate oxide of QP4 to QP4's source or drain regions will set up a fault condition—i.e., that excess leakage through QP4 and onto the bus will occur, i.e., that the unit will fail the output leakage specification. There is another phenomenon to consider also and that is that once the overvoltage has leaked away from $PV_{cc}$, $PV_{cc}$ will end up clamped at a voltage $V_{cc}-V_f$, due to its connection to the high-potential power line across the source-bulk junction of QP4. (Here, $V_f$ is the voltage drop across the forward-biased bulk-source pn junction of QP4.) The primary concern here is that when $PV_{cc}$ drops significantly below $V_{cc}$ the drain potential of QP1—which follows its source potential: $PV_{cc}$—is no longer great enough to ensure that the channel of QP4 does not form. I.e., QP4 may turn on even though the buffer is supposed to be in its high-Z state. The gate of QP4 must never be allowed to become negative with respect to the source of QP4 by more than $|V_{TP}|$. Since $V_f$ can exceed $|V_{TP}|$, the circuit of FIG. 2 may lead to a violation of this condition.

It should be noted that the possibility of the output node being driven above $V_{cc}$, but not by very much, is not just a theoretical one. In general, the other buffers coupled to the common bus can include some with bipolar output stages, which will put out logic-high voltages directly in the range of present concern, namely $(V_{cc}+|V_{TP}|)>V_{oH}>V_{cc}$.

There are also circumstances where the output node can be driven to voltages below that of the low-potential power rail of the buffer. Without protection, the output pulldown transistor will provide a current leakage path. In the simple output buffer, the output node will be connected directly to the drain of the pulldown transistor. See, e.g., QN6 in FIG. 1. The drain will be an $n^+$ region in a PWELL, which in turn will be connected directly to the low-potential power rail. If the control node connected to the drain is negative with respect to the low-potential power rail, typically GND, the pn junction between the bulk and drain of the output pulldown transistor will be forward biased and current will flow from the low-potential power rail out to the bus. By this means, the low-potential power rail will be corrupted by the bus voltage in a similar manner to that described above for overvoltages. By analogy, this can be characterized as an undervoltage problem.

What is needed therefore is a circuit which will permit the output node of an output buffer to be driven above $V_{cc}$ without allowing an increase in $I_{oz}$—the current drained from the bus into an inactive buffer through the buffer's output node—or $I_{cc}$—the current passing directly between the two power rails of the buffer—even for those cases where the increment by which the output node voltage exceeds $V_{cc}$ is less than $VT_{TP}$. What is also needed is a circuit which will permit the output node of an output buffer to be driven to voltages below the buffer's low-potential power rail without allowing an increase in $I_{oz}$ or $I_{cc}$, even for those cases where the increment by which the output node voltage goes below the low-potential power rail voltage is less than $V_{TP}$. A final constraint is that these power-rail protection needs be met with the introduction of a minimum quantity of additional circuitry.

SUMMARY OF THE INVENTION

The present invention utilizes the pseudo-rail approach to protect an output buffer against voltage excursions at the buffer's output node, which will in general be coupled to a common bus. It extends this guarding to either the high- or low-potential power rail of the buffer. To ensure that there are no "dead zones" in the protection, i.e., no range of output node voltages for which the pseudo-rail does not provide protection, the present invention includes a supplementary connection between the pseudo-rail and whichever power rail is to be protected. In this manner, the "float" to which the earlier-described protection was subject is avoided.

For definitiveness, the low-potential power rail of the buffer being protected will be identified as GND, and the high-potential power rail as $V_{cc}$. The purpose of the present invention is to minimize the various types of leakage current between the bus and the inactive buffer: (1) $I_{oZL-}$, bus-buffer leakage current when the buffer is in its high-Z state and the bus is at a voltage below GND; (2) $I_{oZL}$, bus-buffer leakage current when the buffer is in its high-Z state and the bus is at a voltage between GND and $V_{cc}-|V_{TP}|$; (3) $I_{oZH}$, the bus-buffer leakage current when the buffer is in its high-Z state and the bus is at a voltage between $(V_{cc}-|V_{TP}|)$ and $V_{cc}+|V_{TP}|$); (4) $I_{oZH+}$, the bus-buffer leakage current when the buffer is in its high-Z state and the bus is at a voltage in excess of $(V_{cc}+|V_{TP}|)$. It is a constraint on the invention that this purpose be realized without introducing changes which will degrade the buffer's active-state operation, in particular by increasing static current leakage between the power rails $V_{cc}$ and GND while the buffer is sourcing current to, or sinking current from, the bus.

Overvoltage Protection

Figure 3:
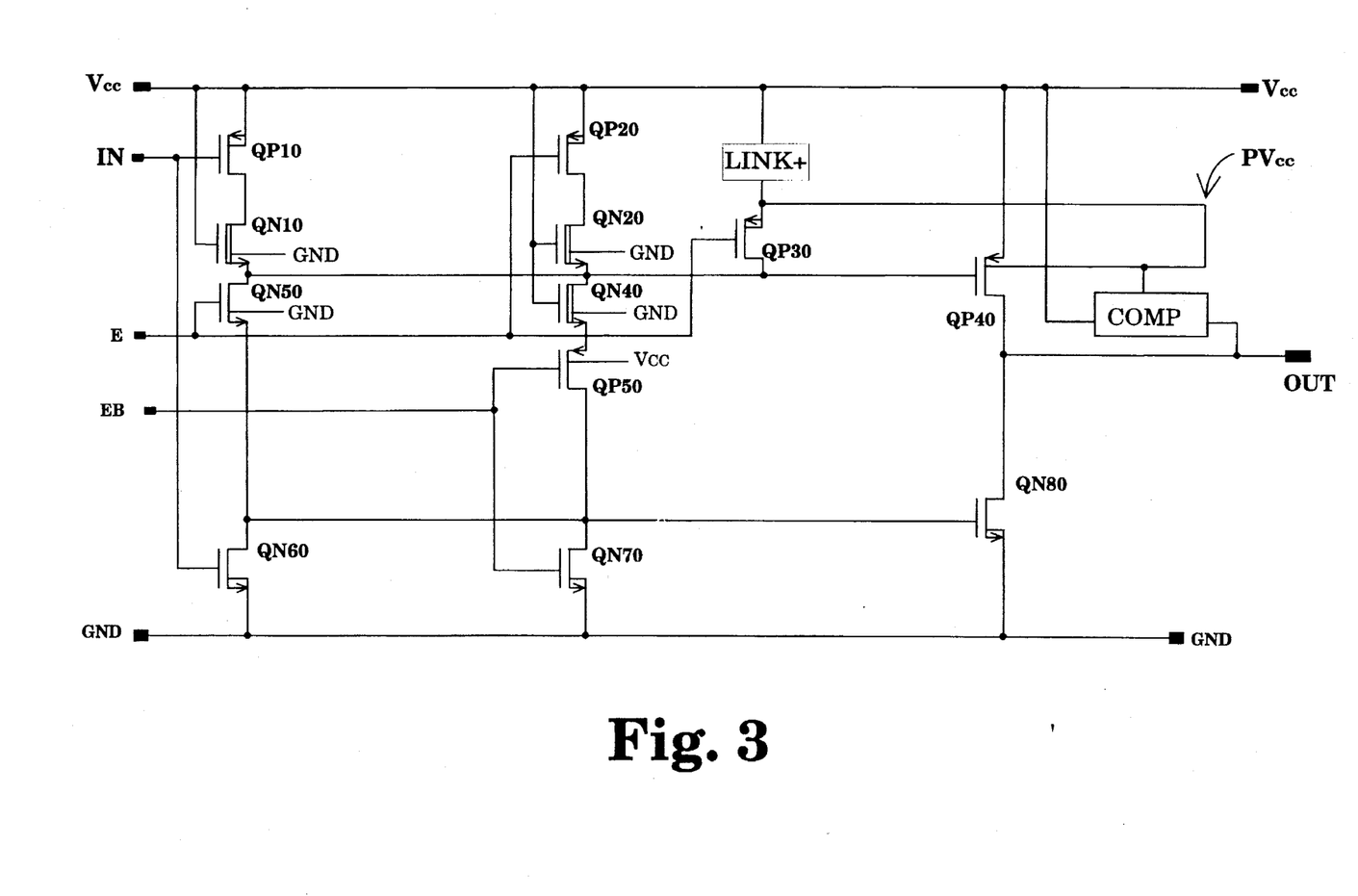
FIG. 3 General circuit depicting the present invention as applied to overvoltage protection.

The overvoltage protection circuit of the present invention is shown schematically in FIG. 3. Those elements which serve the same function as respective elements of the FIG. 1 circuit are designated with the same numbers. It allows for the fact that the comparator COMP used to connect either OUT or $V_{cc}$ to the pseudo-rail $PV_{cc}$ is not perfect, that there is a range of output voltages that while greater than $V_{cc}$ is close enough to $V_{cc}$ that the comparator does not function. In the present invention, this range, this "dead zone" is compensated for by a supplemental one-way link between $V_{cc}$ and $PV_{cc}$, LINK+. The function of LINK+ is to enable the high-potential power rail to energize $PV_{cc}$, to be coupled to $PV_{cc}$, but only when the voltage of the power rail is higher than that of the pseudo-rail $PV_{cc}$. LINK+ will energize $PV_{cc}$ when it would otherwise be left floating as the result of the comparator COMP failing to connect either comparator input to the comparator output, but will prevent any current from passing from $PV_{cc}$ to the power rail (for those circumstances where $PV_{cc}$ has been connected to the output node when the latter is at $V_{oH+}$, i.e., at a voltage significantly above $V_{cc}$). A number of circuit elements or combinations of elements can be used for LINK+. In principle, a diode can serve this function, providing that it is a diode exhibiting a smaller forward drop than occurs in pn junctions of the type found in the transistors of this circuit. The deficit with the earlier art which the present invention seeks to remedy is that it results in the pseudo-rail, when it is left floating by the comparator, settling at a voltage $V_{cc}-V_f$ where $V_f$ is the drop across the forward-biased source/bulk pn junction of the pullup transistor Q40. Whatever circuit is used for the supplemental linking means LINK+ must clamp $PV_{cc}$ at a voltage higher than $(V_{cc}-V_f)$.

With continuing reference to FIG. 3, note that whenever the buffer is in its high-Z state the gate voltage of the pullup transistor QP40 will be coupled directly to $PV_{cc}$ through the feedback transistor QP30 and the logic-low voltage applied to the QP30 gate by enable input E. When the buffer is in the active state, the logic-high voltage applied to the QP30 gate by E ensures that QP30 remains off.

Note the way in which the $V_{oH+}$ voltage applied to the gate of the pullup transistor QP40 is blocked from travelling up the pullup-transistor-driver branch to the high-potential power rail. The earlier art accomplished this blockage by making the pullup transistor driver an NMOS instead of a PMOS, and complementing the input signal accordingly, as shown in FIG. 1 and FIG. 2. This ensured that when an overvoltage was applied to the drain of the driver transistor, it reverse-biased the source/bulk pn junction and thus was blocked. However, this approach had the disadvantage that additional extra circuit elements were needed to invert the input signal IN. The present invention utilizes a conventional PMOS pullup-transistor-driver transistor QP10, and effects the blocking by placing an NMOS transistor QN10 with its gate locked at $V_{cc}$ in series with this driver transistor. As can be seen from FIG. 3, QN10 will normally be conducting (and hence no impediment to coupling $V_{cc}$ to the gate of the pullup transistor QP40 when a logic-low signal is input at IN; indeed it is manufactured to have a very low $VT_{TN}$—and hence an especially low voltage drop across the conducting channel—as is implied by the double channel line). However, with the gate of QN10 at $V_{cc}$ and the source of QN10 at $V_{oH+}(>V_{cc})$, QN10 is off. Furthermore, the source/bulk pn junction is reverse biased, preventing any sink route for the high voltage imposed on the QP40 gate, ultimately from the output node OUT.

Undervoltage Protection

Figure 4:
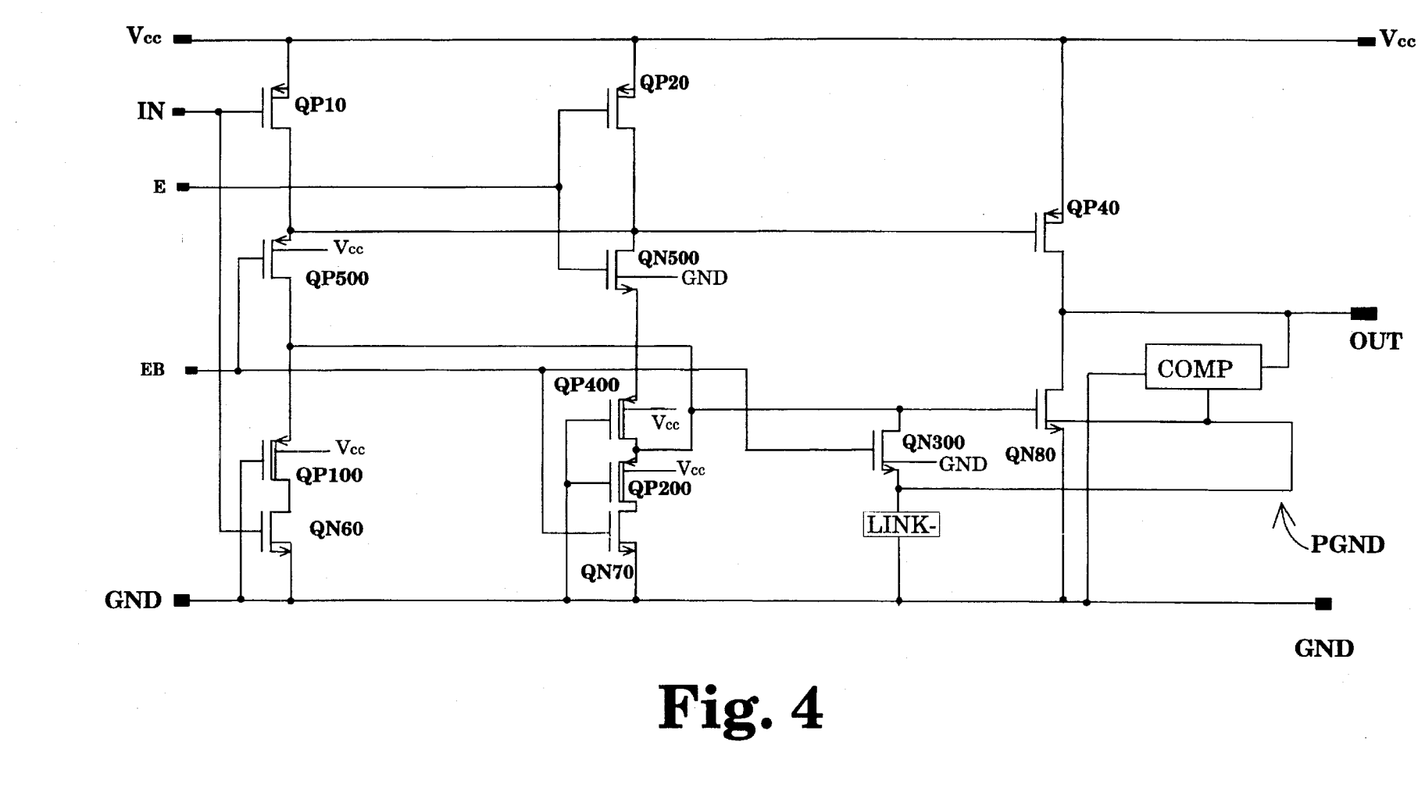
FIG. 4 General circuit depicting the present invention as applied to undervoltage protection.

FIG. 4 shows the circuit providing undervoltage protection pursuant to the present invention. It can be seen to be completely analogous to the overvoltage protection circuit of FIG. 3. Those elements of FIG. 4 which are identical to those of FIG. 3 have been given the same numbers; those which perform analogous functions are numbered in an analogous way. Here the pseudo-rail is labelled as PGND, since it is the pseudo-low-potential-rail. The PMOS transistor of FIG. 4 which plays an analogous role to that of the NMOS transistor QN10 of FIG. 3 is labelled QP100, and so forth. The supplemental link LINK- coupling the pseudo-rail PGND to the low-potential power rail GND serves to clamp the voltage of PGND whenever, because of a dead zone in the comparator COMP, PGND is left to float. NMOS transistor QN300 is the feedback transistor, ensuring that the gate of the output pulldown transistor QN80 follows PGND, so long as the buffer is in its high-Z state, by virtue of the gate of QN300 being held at logic-high by the complementary enable input EB. In this circuit, PMOS transistors QP100 and QP200 play the role of blocking transistors guarding the pulldown drivers QN60 and QN70.

PREFERRED EMBODIMENT OF THE INVENTION

Overvoltage Protection

Figure 5:
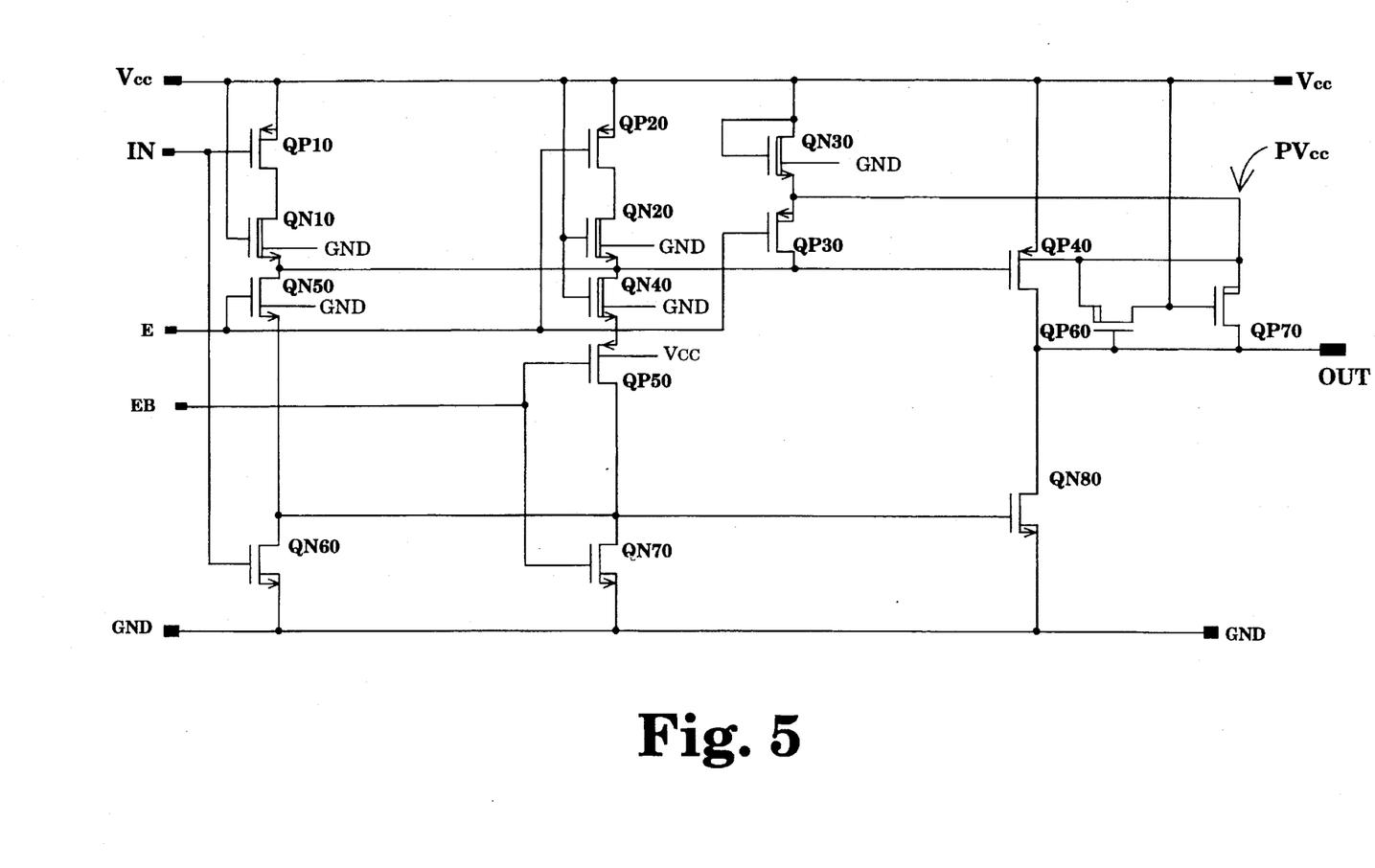
FIG. 5 The circuit incorporating the Preferred Embodiment of the present invention for overvoltage protection.

FIG. 5 sets out a three-state buffer circuit incorporating the present invention's Preferred Embodiment for dealing with overvoltage at the buffer output node while the buffer is in its high-Z state. It is assumed that the output node OUT of this buffer is to be coupled directly to a common bus with which the buffer can exchange data, primarily in the form of logic-low and logic-high signals, while in its active state. It is assumed furthermore that this buffer is energized by a power supply putting out a nominal 3.3 volts rail-to-rail and that the common bus will have a diversity of other buffers coupled to it, including those with 5-volt MOS output stages and those with bipolar output stages. It is this assumed diversity which tests the requirement that the buffer in its high-Z (inactive) state simply present a high impedance to the bus and in particular that it neither sink current from, nor source current to, the bus, regardless of the bus voltage. The circuit of FIG. 5 addresses the first part of this requirement. It is assumed that this circuit will not be exposed to negative bus voltages, i.e., bus voltages lower than the voltage of the buffer's low-potential power rail, GND. It is seen that the transistor pair QP5 and QP6 make up the comparator COMP of FIG. 3. QP5 and QP6 act as "passgates" for the respective inputs to this comparator, OUT and $V_{cc}$. Note also from FIG. 5 that the NMOS transistor QN30 with its drain and gate in common has been selected for the valve LINK+ shown in the more general circuit of FIG. 3. Linking transistor QN30 is designed to have an especially low value for $V_{TN}$: 0.0 v to 0.4 v in contrast to the typical 0.85 v. This ensures that the forward drop from $V_{cc}$ to $PV_{cc}$ will be much smaller than the forward-bias drop across a silicon pn junction.

Consider first the leakage current $I_{oZL}$, the current the buffer in its high-Z state sinks from the bus when a logic-low voltage ($V_{oL} < V_{cc} - |V_{TP}|$) appears on the bus. The voltage at the enabling node E is logic-low and at the complement node EB logic-high. Output pullup transistor QP40 is off. The first passgate transistor QP60 is turned on by the logic-low external signal applied to its gate, by virtue of its $V_{cc}$ drain voltage. Having QP60 on ensures that the pseudo-rail $PV_{cc}$ is at a potential $V_{cc}$. Furthermore, second passgate transistor QP70, with its gate at the same voltage as its source/bulk ($V_{cc}$) and higher than its drain is cut off. Consequently, there is no pathway for a leakage current $I_{OZL}$ from the bus into the buffer through the buffer's output node. Note the behavior of QN30 and QN40 under this region. With $PV_{cc}$ at the same voltage as the high-potential power rail, QN30 will have the same potential on its drain as it has on its source and consequently there will be no current flow through it. On the other hand, QP30, with its gate at logic-low and its source/bulk at $V_{cc}$, will be on, maintaining the QP40 gate to $V_{cc}$, the same potential as the QP40 bulk and source. (In any event, the gate of pullup transistor QP40 is held at $V_{cc}$ by its link to the high-potential power rail through QP20 and QN20 and the fact that E is at logic-low while the buffer is in its high-Z state.) Consequently QP40 remains off, blocking the other path between the output node OUT and the high-potential power rail $V_{cc}$.

Assume next that the bus changes to a voltage higher than $V_{cc}-|V_{TP}|$, but not as high as $V_{cc}+|V_{TP}|$. This will allow QP60 to be cut off, but will not be enough to turn on QP70. Unlike the case of the related art, however, this will not leave $PV_{cc}$ floating; through its connection to $V_{cc}$ through QN30, the supplemental link, $PV_{cc}$ will be maintained at a voltage no lower than $V_{cc}-|V_{TN(QN30)}|$. $V_{TN(QN30)}$ is the threshold voltage for NMOS transistor QN30, which is manufactured so as to have a very low threshold voltage, typically between 0.0 and 0.4 volts. (The double line for the channel of this transistor—and others in FIG. 5—indicates a very low threshold.) QN50 and QP50 are cut off—by virtue of the E/EB voltages required for the high-Z state—isolating the gates of output pullup transistor QP40 and output pulldown transistor QN80. The gate node of output pullup transistor QP40 is charged to $V_{cc}$ through QN30 and QP30, as well as by QP20 and QN20 (as set out above). QN70 is turned on by the logic-high signal to its gate from EB. QN70 in turn discharges the gate of pulldown transistor QN80 to GND and thus holds QN80 off.

Next, assume that the bus is driven to a voltage higher than $V_{cc}+|V_{TP}|$. This results in second passgate transistor QP70 turning on and coupling the output node OUT, at voltage $V_o$, to $PV_{cc}$. This in turn causes the voltage of the QP30 source to rise to $V_o$. As the drain of QP40 rises with $V_o$, the gate of QP40 tracks $V_o$ and prevents QP40 from turning on and providing a path to corrupt $V_{cc}$. Because of its connection to $PV_{cc}$, the bulk of QP40 also tracks $V_o$, preventing the pn junction between the drain and bulk from becoming forward-biased. QN10, QN20, and QN40 act as blocking devices to prevent the overvoltage on the node containing the QP40 gate from reaching $V_{cc}$ through the channels or drain/bulk pn junctions of QP10 or QP20 or the source-isolating pn junction of QP50 (the bulk of which is tied to $V_{cc}$).

Undervoltage Protection

Figure 6:
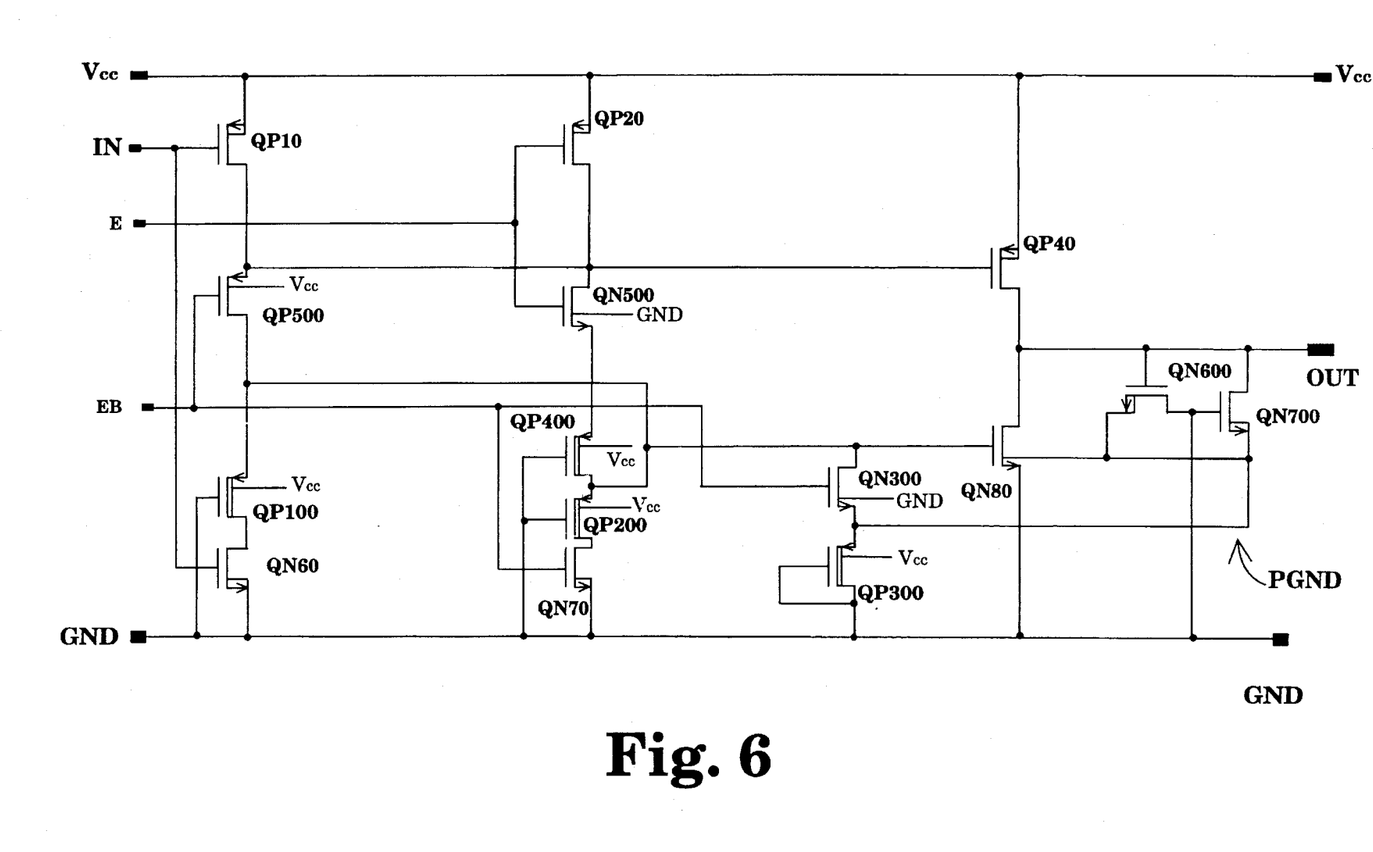
FIG. 6 The circuit incorporating the Preferred Embodiment of the present invention for undervoltage protection.

The present invention's Preferred Embodiment for providing undervoltage protection, i.e., protection of the buffer's low-potential power rail against corruption by an output node voltage lower than the voltage of that power rail, is depicted in FIG. 6. As can be seen, this circuit is completely analogous to that shown in FIG. 5, for overvoltage protection. I.e., NMOS transistors QN600 and QN700 make up the specific comparator COMP shown in the more general circuit of FIG. 4. Similarly, the gate-clamped PMOS transistor QP300 is what has been selected in the Preferred Embodiment to serve the function of the supplemental link LINK—shown in the more general circuit of FIG. 4. The detailed operation of this circuit for various values of output node voltage $V_o$ while the buffer is in the high-Z state follows directly from the discussion immediately above for the overvoltage protection in the Preferred Embodiment.

I claim:

1. Protective circuit apparatus for guarding an output transistor and a power rail of an output buffer against voltages applied to an output node of said buffer, said apparatus comprising (a) a comparator with a plurality of comparator inputs and a comparator output, (b) a pseudo-power-rail, (c) a one-way link having a positive node and a negative node such that current can flow only from said positive node to said negative node and then only when said positive node is at a positive voltage with respect to said negative node, wherein said pseudo-power-rail is connected: (i) to said comparator output, (ii) to a bulk node of said output transistor, and (iii) to said negative node of said one-way link, wherein a first of said comparator inputs is connected to said power rail, wherein a second of said comparator inputs is connected to said output node, and wherein said comparator couples to said comparator output whichever of said comparator inputs is at a higher voltage, and wherein said positive node of said one-way link is connected to said power rail.

2. Protective circuit apparatus as described in claim 1 also comprising a feedback transistor coupled between said pseudo-power-rail and a gate node of said output transistor, wherein a gate node of said feedback transistor is connected to an enable input of said buffer.

3. Protective circuit apparatus as described in claim 2 also comprising a first driver transistor and a first blocker transistor, wherein said first driver transistor is connected in series with said first blocking transistor to form a first driver/blocker combination, wherein said first driver/blocker combination is connected between said power rail and said gate of said output transistor, wherein a gate node of said first driver transistor is connected to a data input node of said buffer, and wherein a gate node of said first blocker transistor is connected to said power rail.

4. Protective circuit apparatus as described in claim 3 also comprising a second driver transistor connected in series with a second blocker transistor to form a second driver/blocker combination, wherein said second driver/blocker combination is connected between said power rail and said gate of said output transistor, wherein a gate node of said second driver transistor is connected to said enable input, and wherein a gate node of said second blocker transistor is connected to said power rail.

5. Protective circuit apparatus as described in claim 1 wherein said comparator includes a first passgate transistor and a second passgate transistor, wherein said first passgate transistor is connected between said bulk node of said output transistor and a gate node of said second passgate transistor, wherein a gate node of said first passgate transistor is connected to said output node, and wherein said second passgate transistor is coupled between said output node and said pseudo-power-rail.

6. Protective circuit apparatus as described in claim 5 wherein said one-way link includes a MOS linking transistor coupled between said power rail and said pseudo-power-rail, wherein a gate node of said linking transistor is coupled to said power rail.

7. Protective circuit apparatus as described in claim 6 wherein said output transistor is a PMOS output pullup transistor, said power rail is a high-potential power rail, said pseudo-power-rail is a pseudo-high-potential-power-rail, said first passgate transistor is a PMOS transistor, said second passgate transistor is a PMOS transistor, and said MOS linking transistor is a low-transition-voltage NMOS transistor.

8. Protective circuit apparatus as described in claim 6 wherein said output transistor is an NMOS output pulldown transistor, said power rail is a low-potential power rail, said pseudo-power-rail is a pseudo-low-potential-power-rail, said first passgate transistor is an NMOS transistor, said second passgate transistor is an NMOS transistor, and said MOS linking transistor is a low-transition-voltage PMOS transistor.

9. An output buffer incorporating a high-potential power rail guarded against overvoltages on an output node, said buffer comprising
   (a) a comparator with a plurality of comparator inputs, one of which is connected to said output node and one of which is connected to said high-potential power rail, and a comparator output,
   (b) a pseudo-high-potential-power-rail couple to a bulk node of a PMOS output pullup transistor, and to said comparator output, and
   (c) a one-way link coupling said pseudo-high-potential-power rail to said high-potential power rail.

10. Buffer as described in claim 9 wherein said comparator includes a first transistor passgate and a second transistor passgate, wherein said first passgate is connected between said bulk of said pullup transistor and a gate node of said second passgate transistor, wherein a gate node of said first passgate transistor is connected to said output node, and wherein said second passgate transistor is connected between said output node and said pseudo-high-potential-power-rail.

11. Buffer as described in claim 10 wherein said one-way link is an NMOS linking transistor coupled between said high-potential power rail and said pseudo-high- potential-power-rail, wherein a gate node of said linking transistor is connected to said high-potential-power rail.

12. Buffer as described in claim 11 wherein said linking transistor is manufactured to have an extremely low transition voltage.

13. Buffer as described in claim 12 having a PMOS feedback transistor coupled between said pseudo-high-potential-power-rail and a gate node of said pullup transistor, wherein a gate node of said feedback transistor is connected to an enable input of said buffer.

14. Buffer as described in claim 13 having a first PMOS driver transistor and a first NMOS blocker transistor,
   wherein a source node of said first PMOS driver transistor is connected to said high-potential power rail,
   wherein a drain node of said first PMOS driver transistor is connected to a drain node of said first NMOS blocker transistor,
   wherein a source node of said first NMOS blocker transistor is connected to said gate node of said pullup transistor,
   wherein a gate node of said first PMOS driver transistor is connected to a data input of said buffer,
   and wherein a gate node of said first NMOS blocker transistor is connected to said high-potential power rail.

15. Buffer as described in claim 14 having a second PMOS driver transistor and a second NMOS blocker transistor,
   wherein a source node of said second PMOS driver transistor is connected to said high-potential power rail,
   wherein a drain of said second PMOS driver transistor is connected to a drain node of said second NMOS blocker transistor,
   wherein a source node of said second NMOS blocker transistor is connected to said gate node of said pullup transistor,
   wherein a gate node of said second PMOS driver transistor is connected to an enable input node,
   and wherein a gate node of said second NMOS blocker transistor is connected to said high-potential power rail.

16. Buffer as described in claim 15 having a third NMOS blocker transistor, a first PMOS isolating transistor and an NMOS disabling transistor,
   wherein said source node of said second NMOS blocker transistor is connected to a drain node of said third NMOS blocker transistor,
   wherein said source node of said third NMOS blocker transistor is connected to a source node of said first PMOS isolating transistor,
   wherein a drain of said first PMOS isolating transistor is connected to a drain node of said NMOS disabling transistor,
   wherein a source node of said NMOS disabling transistor is connected to a low potential power rail, and
   wherein a gate node of said third NMOS blocker transistor is coupled to said high potential power rail, a gate node of said first PMOS blocker transistor is coupled to an disabler input node, and wherein a gate node of said NMOS disabling transistor is connected to said disabler input node.

17. A buffer as described in claim 16 also comprising an output pulldown transistor connected between said output node and said low potential power rail wherein a gate node of said output pulldown transistor is connected to a drain node of said NMOS disabling transistor.

18. An output buffer incorporating a low-potential power rail guarded against undervoltages on an output node, said buffer comprising,
   (a) a comparator with a plurality of comparator inputs, one of which is connected to said output node and one of which is connected to said low-potential power rail, and a comparator output,
   (b) a pseudo-low-potential-power-rail coupled to a bulk node of an NMOS output pulldown transistor, and to said comparator output, and
   (c) a one-way link coupling said pseudo-low-potential-power-rail to said low-potential power rail.

19. Buffer as described in claim 18 wherein said comparator includes a first passgate transistor and a second passgate transistor, wherein said first passgate transistor is connected between said bulk of said pulldown transistor and a gate node of said second passgate transistor, wherein a gate node of said first passgate transistor is connected to said output node, and wherein said second passgate transistor is connected between said output node and said pseudo-low-potential power-rail.

20. An output-buffer-power-rail-protecting method for guarding a high-potential power rail of an inactive-state output buffer against overvoltages on an output node of said buffer, said method comprising the steps of
   (a) connecting a bulk node of an output pullup transistor of said buffer to a pseudo-high-potential-power-rail,
   (b) connecting a first PMOS transistor between said output node and said pseudo-high-potential-power-rail, (c) connecting a second PMOS transistor between said pseudo-high-potential-power-rail and a gate node of said first PMOS transistor, (d) connecting a gate node of said second PMOS transistor to said output node, (e) coupling an NMOS linking transistor between said high-potential power rail and said pseudo-high-potential-power-rail, and coupling a gate node of said linking transistor to said high-potential power rail, (f) connecting a PMOS feedback transistor between said pseudo-high-potential-power-rail and a gate node of said output pullup transistor.

21. Method as described in claim 20 said method further comprising the steps of (a) interspersing an NMOS blocker transistor between a pullup-transistor driver transistor and said gate node of said pullup transistor and (b) connecting a gate node of said NMOS blocker transistor to said high-potential power rail.

22. Method as described in claim 21 said method further comprising the steps of (a) interspersing a second NMOS blocker transistor between a pullup-transistor-disabler transistor and said gate node of said pullup transistor and (b) connecting a gate node of said second NMOS blocker to said high-potential power rail.

23. An output-buffer-power-rail-protecting method for guarding a low-potential power rail of an inactive-state output buffer against undervoltages on an output node of said buffer, said method comprising the steps of (a) connecting a bulk node of an output pulldown transistor of said buffer to a pseudo-low-potential-power-rail, (b) connecting a first NMOS transistor between said output node and said pseudo-low-potential-power-rail, (c) connecting a second NMOS transistor between said pseudo-low-potential-power-rail and a gate node of said first NMOS transistor, (d) connecting a gate node of said second NMOS transistor to said output node, (e) coupling a PMOS linking transistor between said low-potential power rail and said pseudo-low-potential-power-rail, and coupling a gate node of said linking transistor to said low-potential power rail, (f) connecting an NMOS feedback transistor between said pseudo-low-potential-power-rail and a gate node of said output pulldown transistor.

24. Method as described in claim 23 said method further comprising the steps of (a) interspersing a PMOS blocker transistor between a pulldown-transistor driver transistor and said gate node of said pulldown transistor and (b) connecting a gate node of said PMOS blocker transistor to said low-potential power rail.

25. Method as described in claim 24 said method further comprising the steps of (a) interspersing a second PMOS blocker transistor between a pulldown-transistor-disabler transistor and said gate node of said pulldown transistor and (b) connecting a gate node of said second PMOS blocker to said low-potential power rail.

* * * * *